United States Patent [19]

Lee

[11] Patent Number: 4,996,169

[45] Date of Patent: Feb. 26, 1991

[54] SEMICONDUCTOR LASER ASSEMBLY

[75] Inventor: Wai-Hon Lee, Cupertino, Calif.

[73] Assignee: Pencom International Corp., Sunnyvale, Calif.

[21] Appl. No.: 525,525

[22] Filed: May 18, 1990

Related U.S. Application Data

[62] Division of Ser. No. 313,691, Feb. 21, 1990.

[51] Int. Cl.[5] .......................................... H01L 25/16
[52] U.S. Cl. .................................. 437/209; 437/902; 372/36; 372/43; 357/81; 228/904
[58] Field of Search .................. 437/209, 214, 902; 357/19, 81, 74, 75; 228/904; 372/36; 250/239

[56] References Cited

U.S. PATENT DOCUMENTS

| | | | |
|---|---|---|---|
| 4,403,243 | 9/1983 | Hakamada | 357/74 |
| 4,604,753 | 8/1986 | Sawai | 372/36 |
| 4,757,197 | 7/1988 | Lee | 250/239 |
| 4,818,099 | 4/1989 | Preikschat et al. | 356/5 |
| 4,847,848 | 7/1989 | Inoue et al. | 372/50 |
| 4,924,473 | 5/1990 | Burgyan et al. | 372/38 |

Primary Examiner—Olik Chaudhuri
Assistant Examiner—Ken S. Kim
Attorney, Agent, or Firm—Townsend and Townsend

[57] ABSTRACT

A semiconductor laser assembly is provided with a photodetector module and a laser module mounted on orthogonal surfaces of a heatsink. The photodetector module includes a photodetector and two electrically isolated wire bond blocks, each with two surfaces parallel to the orthogonal surfaces of the heatsink. The laser module includes a laser diode bonded and a wire bond region with two surfaces also parallel to the orthogonal surfaces of the heatsink. Both of the wire bond block surfaces of the photodetector modules are thus parallel to the wire bond region surfaces on the laser module, allowing wire connections to be made between parallel surfaces before the heat sink is mounted on a header. One of the surfaces of each of the wire bond blocks and regions is parallel to the pins of a header, allowing attachment of wires from the photodetector module and the laser module to the pins without rotating the header and pins.

10 Claims, 8 Drawing Sheets

SEMICONDUCTOR LASER ASSEMBLY

This is a Division of application Ser. No. 313,691 filed 2/21/90.

FIELD OF THE INVENTION

This present invention relates to a semiconductor laser assembly containing a laser diode for emitting a laser beam and photodetectors for detecting the laser beam reflected from an external target.

BACKGROUND OF THE INvENTION

A laser diode is a semiconductor device which emits light of substantially a single wavelength. The light from a laser diode can be focused to a spot with a diameter comparable to the light wavelength. The laser diode belongs to the same family of semiconductor devices as the LED (light emitting diode). However, the light from an LED has a broader spectrum of wavelengths and thus cannot be focused as sharply as a laser diode. The configuration and composition of the laser diode determines its wavelength, expected lifetime and light guiding mechanism.

Semiconductor laser diodes are generally mounted on a substrate or structure which provides the electrical, thermal, and spatial needs of the laser diode for the intended application. The combination of a substrate or structure With a laser diode is commonly referred to as a laser assembly. Examples of laser assemblies are shown in U.S. Pat. Nos. 3,257,626, 3,293,513, 3,457,468, 3,479,613, and 4,483,480.

Most commercial laser assemblies contain a photodetector behind the laser to monitor the level of light emitted by the laser diode. The monitoring photodetector provides a signal which is used to maintain a constant laser output. It has been noted in some applications that when a small amount of light emitted from the laser is fed back into the laser diode, it causes a change in the laser output power which can be detected by the monitoring photodetector.

Many commercial applications use a second photodetector in front of and below the laser diode to monitor laser light reflected off of an object located in front of the laser diode. The second photodetector provides a signal which can be used to determine the reflective properties of the illuminated portion of the object such as optical storage media.

Figure 1A:
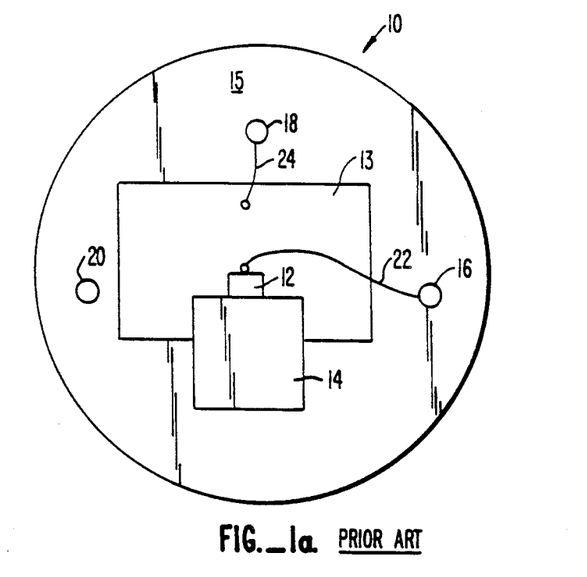
FIGS. 1a and 1b are front and side views, respectively, of a typical prior art laser assembly.
Figure 1B:
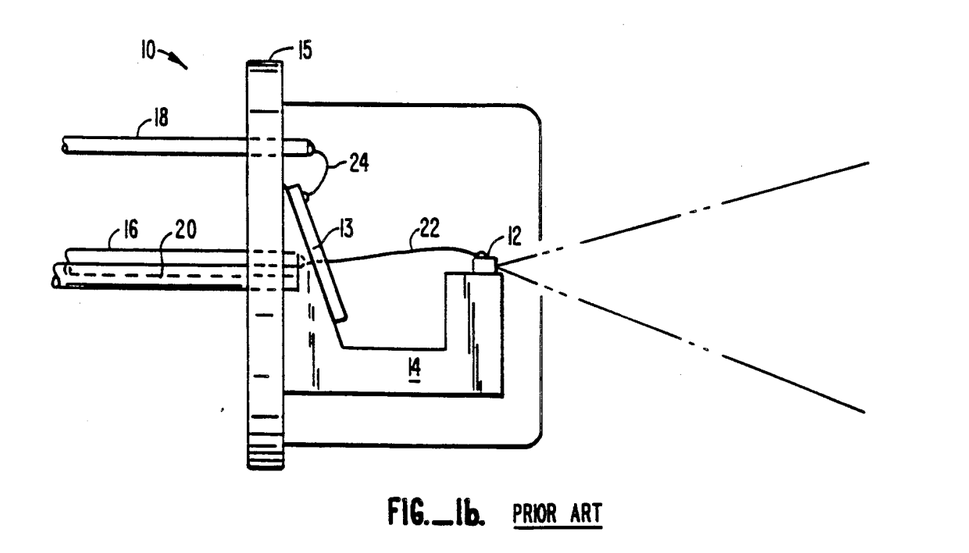

FIGS. 1a and 1b show front and side views, respectively, of a typical prior art laser assembly 10. A semiconductor laser diode 12 and a tilted rear photodetector 13 are mounted on a metal heatsink 14 which, in turn, is mounted on a header 15. The header has three output pins 16, 18, and 20 for external connections. The photodetector is slightly tilted and is located behind the laser diode as shown in the side view of FIG. 1b. This tilt of the photodetector is provided to prevent laser light, which is reflected off of the photodetector, from being fed back into the laser diode.

A wire 22 connects the top or anode of the laser diode to a flat surface on pin 16 that is parallel to the top of the laser diode. A wire 24 connects the front or anode of the photodetector to a beveled end of pin 18. The bottom or cathode of the laser diode is electrically coupled to pin 20 through the heatsink and the header 15. The cathode of the photodetector is also electrically coupled to pin 20 through the header. This provides a three pin laser assembly which is typically packaged in a standard T05 can. Because the cathode of the laser diode shares pin 20 with the cathode of the photodetector, the laser assembly is sometimes called a common cathode device.

Because wires must be bonded on a horizontal surface due to gravitational effects, the laser assembly, including the header and pins, must be placed on its side as shown in FIG. 1b during bonding of wire 22 from the anode of the laser diode to pin 16. After wire 22 is bonded, the laser assembly is then rotated approximately 90 degrees to the orientation shown in FIG. 1(a) for bonding wire 24 from the anode of the rear detector to pin 18. As a result, the bonding process is made more complex because the header and pins must be rotated.

In an alternative assembly, the laser diode is attached to the heatsink with the anode of the laser diode in contact with the heatsink and the cathode of the laser diode in contact with wire 22. In this alternative assembly, the cathode of the photodetector shares pin 20 with the anode of the laser diode. A variation to the three pin devices is a four pin device which uses a silicon submount to electrically isolate the cathode of the laser diode from the heatsink.

In any of the above-described prior art assemblies, the header and pins must be rotated during the bonding process.

Figure 2A:
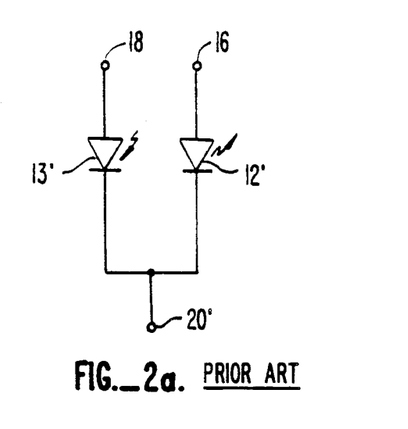
FIG. 2a is a circuit diagram of the common cathode laser assembly shown in FIGS. 1a and 1b.

FIG. 2a shows the electrical circuit of the common cathode laser assembly shown in FIGS. 1a and 1b. Corresponding elements to FIGS. 1a and 1b have primed corresponding numbers. The anode of laser diode 12' is electrically coupled to pin 16'. The anode of photodetector 13' is electrically coupled to pin 18'. The cathodes of laser diode 12' and photodetector 13' share pin 20'.

Figure 2B:
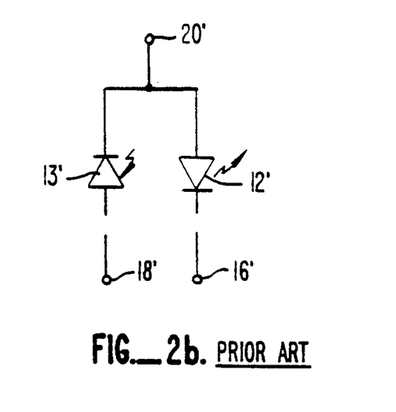
FIG. 2b is a circuit diagram of an alternative embodiment to the laser assembly shown in FIGS. 1a and 1b.

FIG. 2b shows the electrical circuit of the alternative to the laser assembly shown in FIGS. 1a and 1b. Corresponding elements to FIGS. 1a and 1b have primed corresponding numbers. The cathode or lasel diode 12' is electrically coupled to pin 16'. The anode of photodetector 13' is electrically coupled to pin 18'. The anode of the laser diode and the cathode of the photodetector are electrically coupled to pin 20'.

Figure 3:
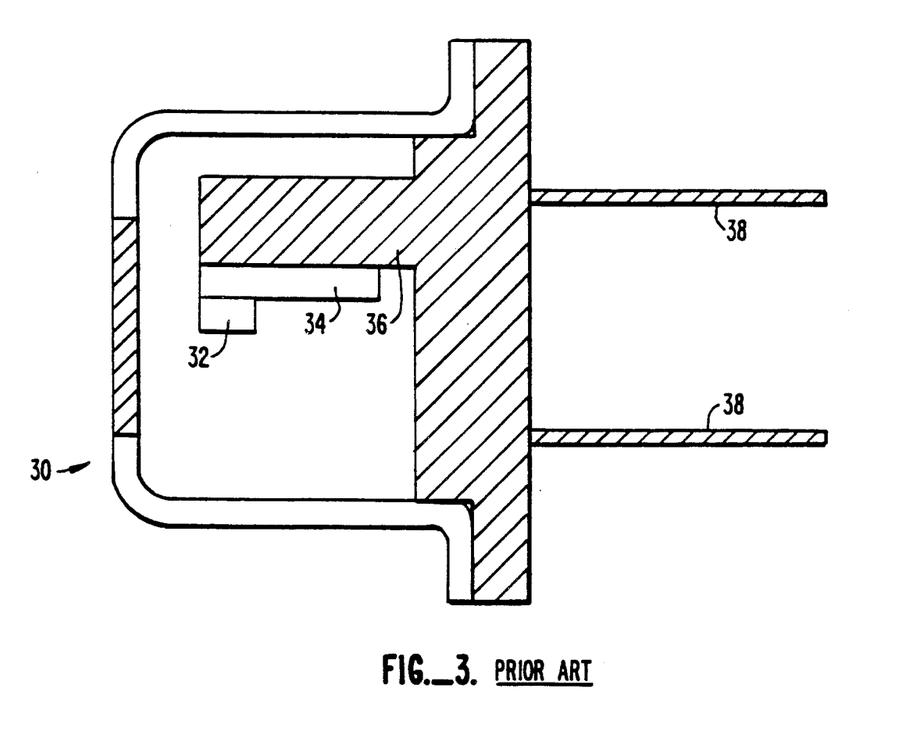
FIG. 3 is a side view of a prior art laser assembly using rear facet detection of the laser output to maintain a constant laser output.

FIG. 3 shows a prior art laser assembly 30 as disclosed in Japanese Pat. Application No. 59-117279(A). This laser assembly uses rear facet detection of the laser output to maintain a constant laser output. A laser diode 32 is attached to a silicon submount 34 which, in turn, is mounted on a copper heatsink 36 with a plurality of output pins 38. The silicon submount is also a photodetector for monitoring the rear facet emission of the laser diode.

The upper surface of the silicon submount next to the heatsink is generally the cathode of the photodetector and is electrically coupled to the copper heatsink by physical contact. A first pole of the laser diode is generally connected to the cathode of the photodetector 34 by a wire. The anode of the photodetector and a second pole of the laser diode are electrically coupled to the pins by separate wires.

Given the geometry of the laser assembly, the wires are first attached to the laser diode and the photodetector, the laser assembly is rotated 90 degrees, and then the wires are attached to the pins. Again, the header and pins are rotated during the bonding process.

Figure 4:
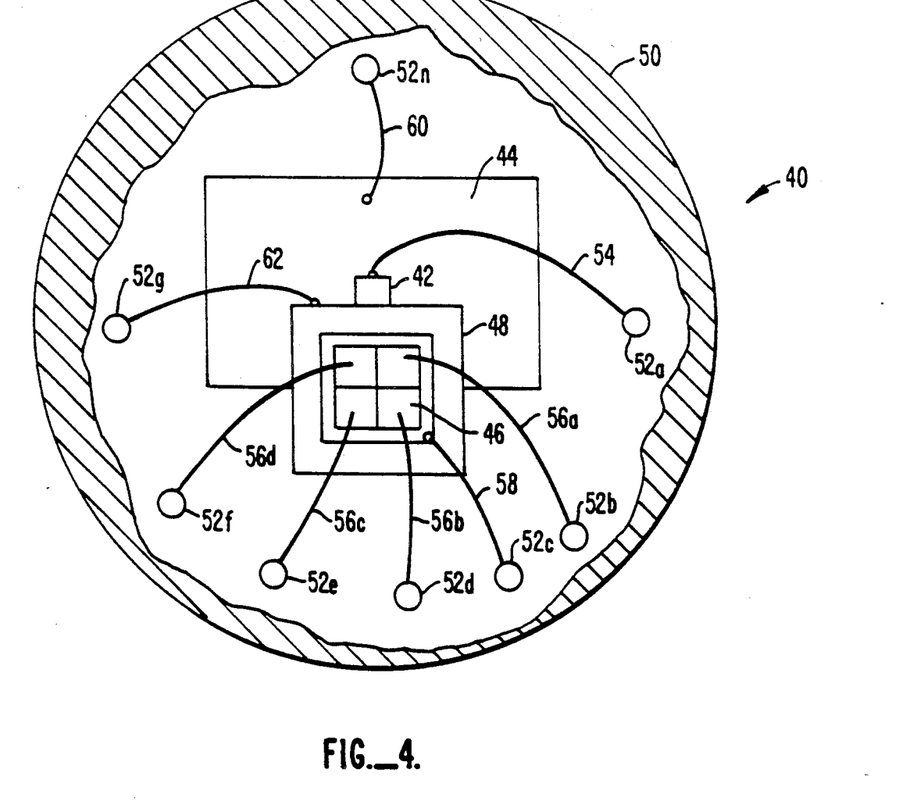
FIG. 4 is a front view of a hybrid laser assembly disclosed in U.S. Pat. No.4,757,197 containing a laser diode and multiple photodetectors.

FIG. 4 shows a front view of a laser assembly 40 as disclosed in U.S. Pat. No. 4,757,197. A semiconductor laser diode 42, a tilted rear photodetector 44 (similar to tilted rear photodetector 13 of FIGS. 1a and 1b), and a forward four quadrant photodetector 46 are mounted on a heatsink 48. The heatsink, in turn, is mounted on a header 50 which has a plurality of output pins 52a-h. The tilted rear photodetector is used to detect rear facet emissions of the laser diode in order to maintain a constant laser output. The forward four quadrant photodetector detects the laser light from the laser diode that has reflected off of an object located in front of the laser diode.

A wire 54 electronically couples the top, or anode, of semiconductor laser 42 to pin 52a. Four wires 56a-d connect a first pole (preferably the anode) of the four quadrants of the four quadrant photodetector to pins 52b, 52d, 52e, and 52f, respectively. Wire 58 connects a common second pole (preferably the cathode) of the four quadrant photodetector to pin 52c. Wire 60 connects the anode of the rear photodetector to pin 52h. The cathode of the laser diode and the rear photodetector are electrically coupled to pin 52g through the heatsink and wire 62.

The laser assembly must be placed on its side while bonding wire 54 from the anode of the laser diode to pin 52a and wire 62 from the cathode of the laser diode to pin 52g. In addition, wires 56a-d and 58 are bonded from the poles of the four quadrant photodetector to the output pins. Furthermore, wire 60 is bonded from the anode of the rear photodetector to pin 52h. As with other prior art, the laser assembly, including the header and pins, must be rotated during the bonding process.

Figure 5:
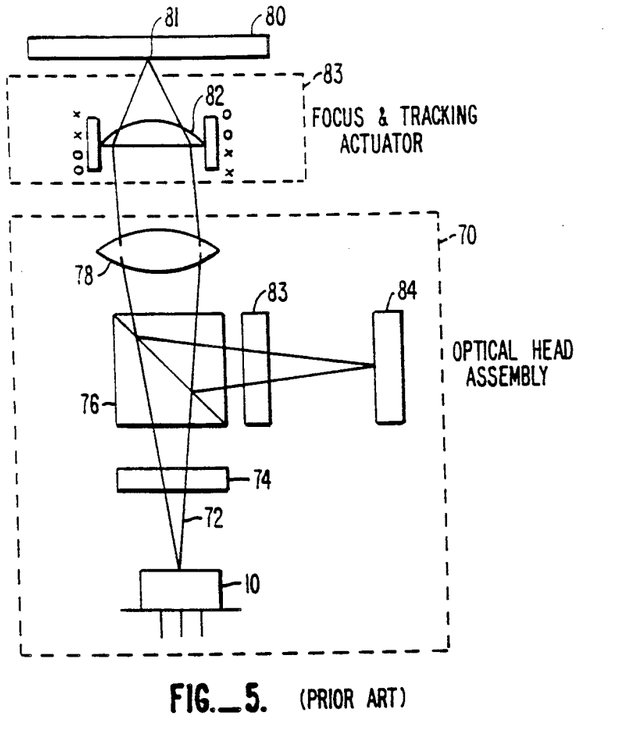
FIG. 5 is a top view of a prior art optical head assembly using the laser assembly of FIG. 1.

The prior art laser assembly 10 shown in FIG. 1 has many applications, one of which is in the optical head assembly 70 shown in FIG. 5. The laser assembly contains a laser diode to provide a light beam 72 which, after passing through a grating 74, a beam-splitter 76 and a collimating lens 78, is focused on an information medium 80 at spot 81 by an objective lens 82. The objective lens is supported by a focus and tracing actuator 83. When the light beam is reflected off the information medium, part of the beam is reflected by the beam splitter through a cylindrical lens 83 to a photodetector 84. The signal recorded on the information medium can be read out from photodetector 84.

Figure 6:
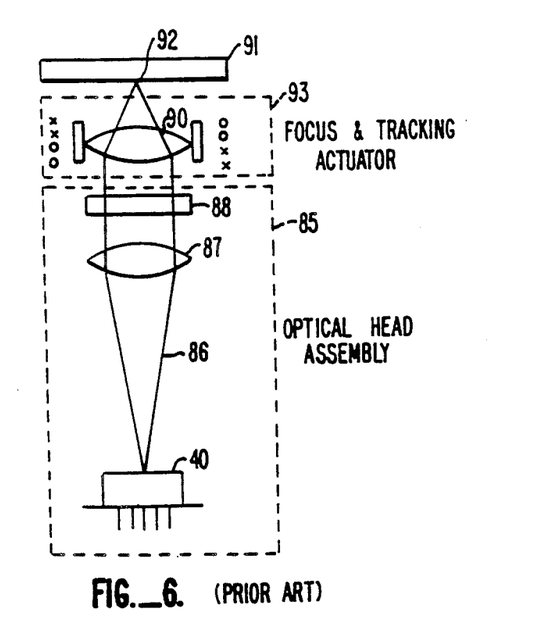
FIG. 6 is a top view of a prior art optical head assembly using the laser detector assembly of FIG. 4.

FIG. 6 shows an optical head assembly 85 using the prior art laser and detector assembly 40 shown in FIG. 4. The laser and detector assembly radiates a laser beam 86 to a collimating lens 87. The collimated beam passes through a hologram lens 88 to an objective lens 90 and focus on an information medium 91 at spot 92. The objective lens is supported by a focus and tracking actuator 93. When the light beam is reflected off the information medium, part of the beam is diffracted by the hologram lens and focuses on the detector part of the laser and detector assembly. A recorded signal on the information medium can be recovered from the signal coming out from the detector.

SUMMARY OF THE INVENTION

An improved semiconductor laser assembly is provided with a photodetector module and a laser module mounted on orthogonal surfaces of a heatsink. The photodetector module includes a photodetector and two electrically isolated wire bond blocks, each with two surfaces parallel to the orthogonal surfaces of the heatsink. The laser module includes a laser diode and a wire bond region with two surfaces also parallel to the orthogonal surfaces of the heatsink. Both of the wire bond block surfaces of the photodetector modules are thus parallel to the wire bond region surfaces on the laser module, allowing wire connections to be made between parallel surfaces before the heat sink is mounted on a header. One of the surfaces of each of the wire bond blocks and region is parallel to the pins of a header, allowing attachment of wires from the photodetector module and the laser module to the pins without rotating the assembly.

The wire bond blocks of the photodetector module are preferably deep diffusions in a semiconductor chip containing a photodetector. A saw cuts the chip after it is attached to the heat sink to isolate the wire bond blocks from the photodetector. The wire bond region of the laser module is preferably a deep diffusion in a semiconductor chip to which the laser diode is attached. The laser diode is preferably attached so that an electrical connection exists between the anode and both surfaces of the wire bond region.

In a preferred embodiment, the laser module is provided with a photodetector located behind the laser diode. The photodetector provides rear facet laser detection for controlling the emissions of the laser diode. The laser module can be further provided with a reverse surge current diode to prevent damage to the laser diode from reverse surge current. In the preferred embodiment, the reverse surge current diode is a photodetector diode that has been covered with a metal layer to prevent light detection and to provide a wire bond surface to one of the electrodes of the diode. A metal covered photosensitive diode is used so that only a single diffusion step is needed to form both the rear facet photodetector and the reverse surge current diode.

In a preferred method, the photodetector module is fabricated and attached to the heatsink. The laser diode is then bonded to the laser module which is bonded to the heatsink. Wires are then bonded between elements on the side surface of the laser module, and from the side surface on the laser module to the side surface on the photodetector module. The assembly is rotated 90° and the heatsink is bonded to the header. Wires are then bonded from the pins to either the top surface of the photodetector module or to the top surface of the laser module.

As a result of the structure of the elements of the laser assembly and of the process of assembly, the header and pins do not need to be rotated during the bonding process. This greatly simplifies the bonding process and allows current commercially available bonding equipment to be used without requiring intervening manual steps that are time consuming and prone to error.

The saw cut method of fabricating the photodetector module requires few steps and automatically aligns the wire bond block surfaces with the surfaces of the heatsink.

The laser assembly may be used in many applications. However, a preferred application would be in the optical head assemblies shown in FIGS. 5 and 6.

For a further understanding of the nature and advantage of the invention, reference should be had to the ensuing detail description taken in conjunction with the accompanying drawings.

BRIEF DESCRIPTION OF THE DRAWINGS

FIG. 9b is a circuit diagram of the device shown in FIG. 9a; and

DETAILED DESCRIPTION OF THE PREFERRED EMBODIMENTS

Figure 7A:
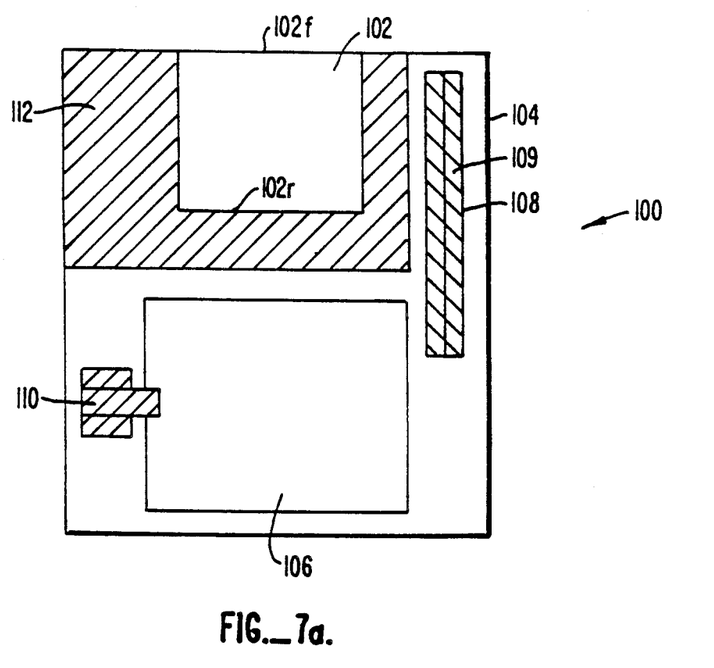
FIGS. 7a and 7b are front and side views, respectively, of a preferred semiconductor laser module for generating a laser beam.
Figure 7B:
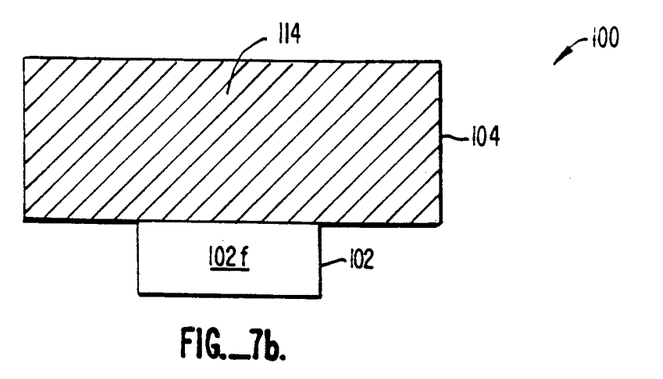

FIGS. 7a and 7b show the front and side views, respectively, of a preferred semiconductor laser module 100 for generating a laser beam. In the preferred embodiment, the laser module includes a laser diode chip 102 mounted on a semiconductor chip 104. The laser diode chip has a forward facet 102f and a rear facet 102r for emitting laser light. The semiconductor chip has a photodetector diode 106 for detecting the rear facet emissions of the laser diode in order to maintain a constant laser output. The semiconductor chip also has a reverse surge current diode 108 for preventing reverse surge currents from damaging the laser diode.

The semiconductor chip is made from a silicon wafer substrate that is made highly conductive with a deep diffusion of arsenic or antimony. The photodetector diode and the reverse surge current diode are formed by implanting (diffusing) into a silicon wafer to form the diodes at the substrate-diffusion junction. In order to simplify fabrication procedures, both of the diodes are made photosensitive. During a metallization step, wire bond areas are positioned at locations 109, 110, 112, and 114. Reverse current diode 108 is covered by layer of metallization 109 to render the diode nonsensitive to light and to serve as a wire bond area to the anode of the diode. Small metallized area 110 is positioned to provide a wire bond area to the anode of the photodetector diode. Due to the conductivity of the laser chip substrate, the cathodes of the photodetector diode and the reverse surge current diode are in common. The common cathode of both diodes has a wire bond area at surface metallization 112 or at edge metallization 114 of the semiconductor 104 chip as shown in FIG. 7B.

The laser diode chip is bonded to metallization area 112 so that one pole of the laser diode (preferably the anode) is in contact with metallization area 112, thereby putting the anode of the laser diode in common with the cathode of the other two diodes. In addition, the other pole of the laser diode (preferably the cathode) is available for wire bonding at the top surface of the laser diode chip parallel to metallization area 112.

Figure 8A:
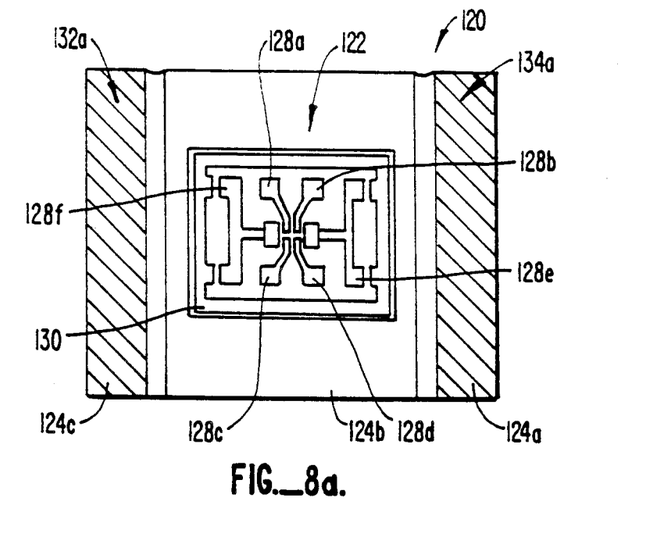
FIGS. 8a and 8b are side and top views, respectively, of a preferred photodetector module on a heatsink for detecting reflected laser light.
Figure 8B:
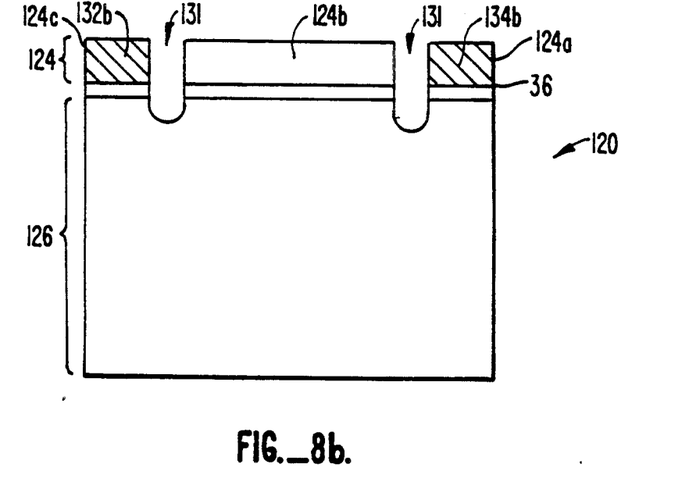

FIGS. 8a and 8b show the side and top views, respectively, of a preferred photodetector module 120 for detecting reflected laser light. In the preferred embodiment, the photodetector module includes a six segment photodetector 122 in a photodetector chip 124 which is mounted on a thermally conducting heatsink block 126.

Similar to the semiconductor chip shown in FIGS. 7a and 7b, photodetector chip 124 is made from a silicon wafer that is made highly conductive with a deep diffusion of arsenic or antimony. The six segment photodetector is formed by implanting (diffusing) into the photodetector chip substrate to form the photodetector diodes at the substrate-diffusion junction. During a metallization step, wire bond areas areas are positioned at locations 128a-f for connections to the anodes of the individual photodetectors. Due to the conductivity of the photodetector chip substrate, the cathodes of the photodetectors are in common and are accessible for wire bonding at a metallized area 130. Areas 132a-b and 134a-b are also metallized for wire bond to the substrate.

The photodetector chip is then attached to heatsink block 126. If the block is made of electrically conductive materials such as copper, then an electrical insulator layer 136 needs to be placed between the chip and the block. If the block is made of an electrically nonconductive yet thermally conductive material such as beryllium oxide (Be0), then the electrically insulating layer is not needed. The photodetector chip 124 is then saw cut at locations 131 to divide the chip into three chips 124a, 124b, and 124c.

Figure 9A:
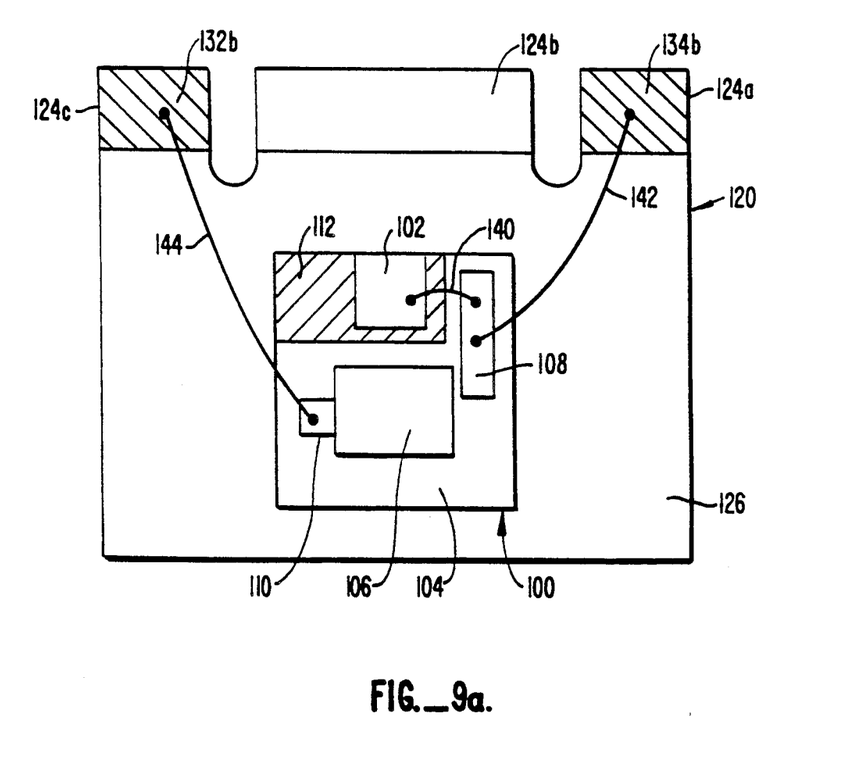
FIG. 9a is a side view of the photodetector module and heatsink of FIGS. 8a and 8b after the laser module has been mounted on the heatsink surface and the appropriate wire connections are made.

FIG. 9a is a side view of photodetector module 120 after laser module 100 has been mounted on the heatsink block 126 and the appropriate wire connections are made. Semiconductor chip 104 is first die attached to a side surface of the heatsink so that the top surface of the semiconductor chip is parallel to the side surface of the heatsink. As with photodetector chip 124, if the heatsink is made of electrically conductive materials, then an electrical insulator layer needs to be placed between the chip and the heatsink. In the preferred embodiment, the laser diode chip 102 is mounted on the semiconductor chip as described with FIGS. 7a and 7b after the semiconductor chip has been mounted on the heatsink block.

A wire 140 connects the anode of laser diode 102 to the anode of reverse surge current diode 108. A second wire 142 connects the anode of the reverse surge current diode to wire bond area 134b. A third wire 144 connects the anode of photosensitive diode 106 to wire bond area 132b.

Figure 9B:
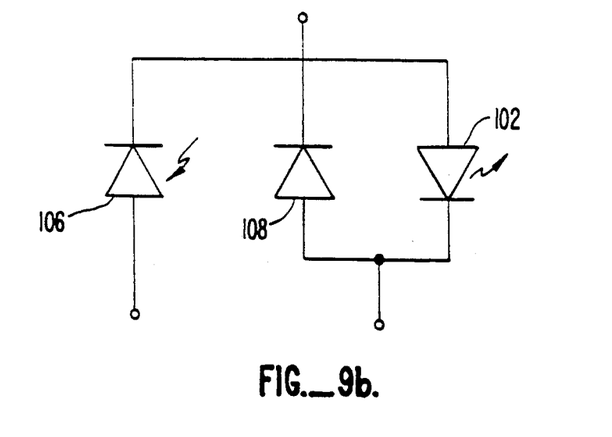

FIG. 9b shows the electrical characteristics of the device shown in FIG. 9a. The anode of laser diode 102 and the cathodes of photodetector diode 106 and reverse surge current diode 108 are electrically coupled together as described in FIGS. 7a and 7b. The cathode of the laser diode is electrically coupled to the anode of the reverse surge current diode with wire 142. In this configuration any accidental negative current occurring in the electrical circuit for delivery current to the laser diode will pass through the reverse surge current diode instead of the laser diode. As a result, the laser diode is protected from negative surge current that may occur in an electrical circuit connected to the laser assembly.

Figure 10A:
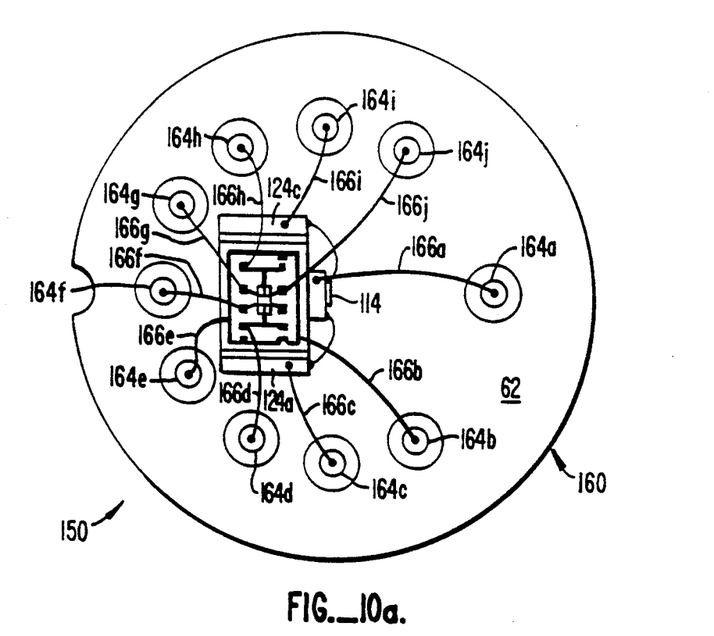
FIGS. 10a and 10b are top and side views, respectively, of a preferred laser assembly after the photodetector module, heatsink, and laser module of FIG. 9A has been mounted on a header module.
Figure 10B:
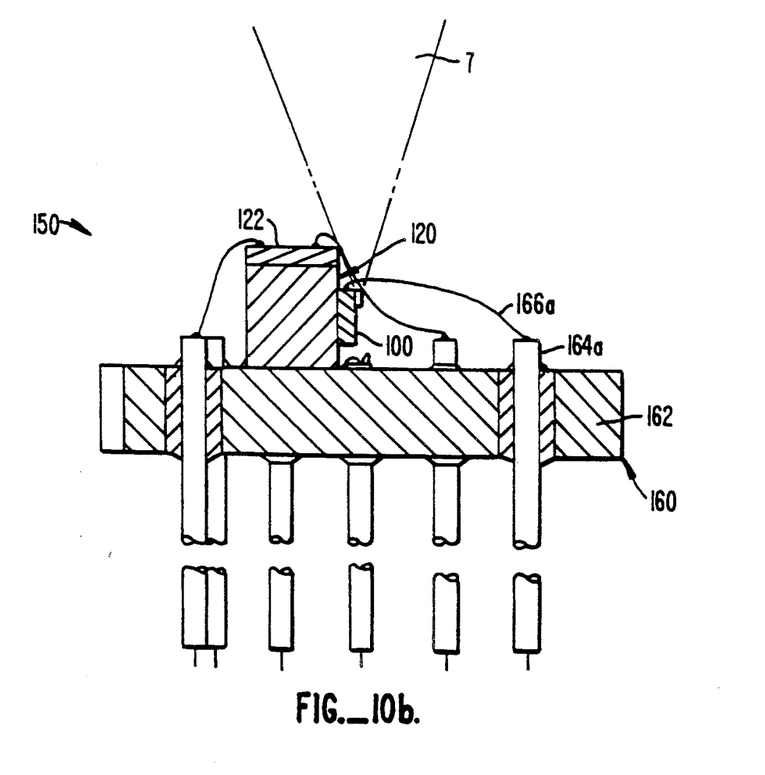

FIGs. 10a and 10b show the top and side views, respectively, of a preferred laser assembly 150 after photodetector module 120, heatsink block 126, and laser module 100 has been mounted on a header module 160. The header module includes a head 162 for mounting the heatsink and ten pins 164a–j having an outer end for external connections and an inner end for wire bonding. The heatsink is bonded to the header so that the top of the photodetector module and the side of the laser module are parallel to the inner end of each pin.

Ten wires 166a–j are then bonded to the modules and the inner ends of the pins in order to electrically couple the various elements of the laser assembly to the ten pins. Wire 166a connects pin 164a with surface 114 of the laser module thereby electrically coupling the laser diode anode, the photodetector diode cathode, and the reverse surge current diode cathode with the pin. Wires 166b, 166d, 166f, 166g, 166h and 166j connect pins 164b, 164d, 164f, 164g, 164h and 164j with the six anodes of the six segment photodetector. Wire 166e connects pin 164e with the common cathode of the six segment photodetector. Wire 166c connects pin 164c with chip 124a of the photodetector module, thereby electrically coupling the laser diode cathode and the reverse surge current diode anode with the pin. Wire 166i connects pin 164i with chip 124c of the photodetector module, thereby electrically coupling the photodetector diode anode with the pin.

This preferred embodiment of the laser assembly has the advantage that the header and pins do not need to be rotated during the bonding process. The dividing of the laser assembly into modules and the single surface wire bonding allows the use of standard commercially available die attaching and wire bonding machines to produce units in high volume.

While the above provides a full and complete disclosure of the preferred embodiments of the invention, various modifications, alternate constructions and equivalents may be employed. For example, the photodetector for detecting the reflected laser beam may have more or less segments than six, the reverse surge current diode may be fabricate as a non-photosensitive diode, and the wire bond blocks may be fabricated separately from the photodetector. Accordingly, the above description and illustrations should not be construed as limiting the scope of the invention, which is defined by the appended claims.

What is claimed is:

1. A method of forming a semiconductor laser assembly, comprising the steps of:
   forming a heatsink having first and second orthogonal surfaces;
   mounting a first semiconductor photodetector on said first surface of said heatsink;
   mounting first and second conductive blocks on said first surface of said heatsink, said conductive blocks being electrically isolated from each other and said first photodetector, each of said conductive blocks having first and second surfaces parallel to said first and second surfaces of said heatsink, respectively, each of said first and second surfaces of said first and second conductive blocks being of sufficient size to act as a wire bonding pad;
   mounting a semiconductor chip on said second surface of said heatsink, including a second semiconductor photodetector and a conductive region having first and second surfaces parallel to said first and second surfaces of said heatsink, respectively, said first surface of said conductive region being of sufficient size to act as a wire bonding pad; and
   mounting a semiconductor laser to said second surface of said conductive region.

2. The method of forming the semiconductor laser assembly of claim 1 further comprising the steps of:
   connecting a first wire between the laser diode and the second surface of the first conductive block;
   connecting a second wire between the second photodetector and the second surface of the second conductive block;
   connecting a third wire between the first surface of the conductive region and a first pin;
   connecting a fourth wire between the first surface of the first conductive block and a second pin;
   connecting a fifth wire between the first surface of the second conductive block and a third pin.

3. The method of forming the semiconductor laser assembly of claim 1 further comprising the step of electrically coupling a reverse surge current diode to the semiconductor laser.

4. The method of forming the semiconductor laser assembly of claim 3 wherein the reverse surge current diode is a photosensitive diode and covered with metal.

5. The method of forming the semiconductor laser assembly of claim 2, further comprising the step of connecting a sixth wire between the semiconductor laser and the reverse surge current diode.

6. The method of forming the semiconductor laser assembly of claim 1 wherein the conductive blocks are formed by mounting a conductive chip to the heatsink and saw cutting the chip.

7. A method of forming a semiconductor laser assembly for generating and detecting a laser beam, comprising the steps of:
   a) forming a laser module for generating said laser beam, the laser module including
      i) first and second orthogonal laser module surfaces,
      ii) a laser module photodetector on the second surface of the laser module having first and second electrodes,
      iii) a laser source on the second surface of the laser module having first and second electrodes,
      iv) a first laser module wire bond area on the second surface electrically coupled to the first electrode of the laser module photodetector,
      v) a second laser module wire bond area on the first surface of the laser module electrically coupled to the second electrode of the laser module photodetector and the first electrode of the laser source, and
      vi) a third laser module wire- bond area on the second surface electrically coupled to the second electrode of the laser source;
   b) forming a photodetector module for detecting said laser beam, the photodetector module having first and second orthogonal photodetector module surfaces and the laser module being attached to the photodetector module with the first and second laser module surface being parallel to the first and second photodetector module surfaces, respectively, the photodetector module including
      i) a photodetector module photodetector located on the first photodetector module surface having first and second electrodes,
      ii) a first photodetector module wire bond area located on the first photodetector module surface electrically coupled to the first electrode of the photodetector module photodetector,
iii) a second photodetector module wire bond area located on the second photodetector module surface electrically coupled to the second electrode of the photodetector module photodetector,
iv) a third photodetector module wire bond area located on the first photodetector module surface,
v) a fourth photodetector module wire bond area located on the second photodetector module surface electrically coupled to the third photodetector module wire bonding;
vi) a fifth photodetector module wire bond area located on the first photodetector module surface, and
vii) a sixth photodetector module wire bond area located on the second photodetector module surface electrically coupled to the third photodetector module wire bonding;

c) connecting a first wire between one the first laser module wire bond area and the fourth photodetector module wire bond area;

d) connecting a second wire between the third laser module wire bond area and the sixth photodetector wire bond area.

e) forming a header having at least five output pins for external electrical connections, each pin having a pin wire bond area, each pin wire bond area being parallel to the other pin wire bond areas, the photodetector module being attached to the header with the second photodetector module surface and the second laser module surface being parallel to the pin wire bond areas;

f) connecting a third wire between the second laser module wire bond area and one of the pin wire bond areas;

g) connecting a fourth wire between the third photodetector module wire bond area and one of the pin wire bond areas; and h) connecting a fifth wire between the fifth photodetector module wire bond area and one of the pin wire bond areas.

8. The method of forming the laser assembly of claim 7 wherein the laser source is a semiconductor laser diode.

9. The method of forming the laser assembly of claim 8, wherein forming the laser module further comprises the step of forming a reverse surge current diode for preventing reverse surge voltage, the reverse surge current diode having a first electrode and a second electrode, the first electrode of the reverse surge current diode being electrically coupled to a second electrode of the laser source and the second electrode of the reverse surge current diode being electrically coupled to the first electrode of the laser source.

10. The method of forming the laser assembly of claim 9 wherein the reverse surge current diode is a photosensitive diode located on the first surface of the laser module, the reverse surge current diode being coated with metal to prevent the diode from being photosensitive.

* * * * *